(12) United States Patent
Ait-Mani et al.

(10) Patent No.: US 10,483,188 B2
(45) Date of Patent: Nov. 19, 2019

(54) COMPENSATION OF AN ARC CURVATURE GENERATED IN A WAFER

(71) Applicant: COMMISSARIAT À L'ENERGIE ATOMIQUE ET AUX ENERGIES ALTERNATIVES, Paris (FR)

(72) Inventors: Abdenacer Ait-Mani, Saint-Egrève (FR); Bertrand Chambion, Pontcharra (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/062,902

(22) PCT Filed: Dec. 14, 2016

(86) PCT No.: PCT/FR2016/053440
§ 371 (c)(1),
(2) Date: Jun. 15, 2018

(87) PCT Pub. No.: WO2017/103487
PCT Pub. Date: Jun. 22, 2017

(65) Prior Publication Data
US 2018/0366389 A1    Dec. 20, 2018

(30) Foreign Application Priority Data

Dec. 15, 2015 (FR) ...................... 15 62359

(51) Int. Cl.
*H01L 23/58* (2006.01)
*H01L 23/373* (2006.01)
(Continued)

(52) U.S. Cl.
CPC .... *H01L 23/3738* (2013.01); *H01L 21/02005* (2013.01); *H01L 21/0243* (2013.01);
(Continued)

(58) Field of Classification Search
CPC .......... H01L 21/0243; H01L 21/02664; H01L 21/76877; H01L 21/02005; H01L 21/76837; H01L 23/3738
(Continued)

(56) References Cited

U.S. PATENT DOCUMENTS

| 8,754,505 B2 * | 6/2014 | Colnat ................ H01L 21/2007 257/506 |
| 2007/0292987 A1 | 12/2007 | Yoon et al. |
| 2012/0018855 A1 | 1/2012 | Colnat |

FOREIGN PATENT DOCUMENTS

| JP | S56-140631 A | 11/1981 |
| JP | 2002-134451 A | 5/2002 |
| WO | 2010/102686 A1 | 9/2010 |

OTHER PUBLICATIONS

Mar. 28, 2017 International Search Report issued in Patent Application No. PCT/FR2016/053440.

* cited by examiner

*Primary Examiner* — Luan C Thai
(74) *Attorney, Agent, or Firm* — Oliff PLC

(57) ABSTRACT

This method comprises the steps of: a) forming a set of first trenches on the first surface of the wafer; b) forming a set of second trenches on the second surface of the wafer, at least partially facing the first trenches; c) filling the first trenches with a first material having a CTE $\alpha_1$; d) filling the second trenches with a second material having a CTE $\alpha_2$, and verifying $\alpha_2 > \alpha_0$ or $\alpha_2 < \alpha_0$ depending on whether the first material verifies $\alpha_1 > \alpha_0$ or $\alpha_1 < \alpha_0$.

18 Claims, 1 Drawing Sheet

(51) Int. Cl.
    *H01L 21/02*     (2006.01)
    *H01L 21/768*     (2006.01)
    *H01L 21/18*     (2006.01)
    *H01L 21/20*     (2006.01)

(52) U.S. Cl.
    CPC .. *H01L 21/02664* (2013.01); *H01L 21/76837* (2013.01); *H01L 21/76877* (2013.01); *H01L 21/187* (2013.01); *H01L 21/2007* (2013.01)

(58) Field of Classification Search
    USPC ........................................................ 257/633
    See application file for complete search history.

COMPENSATION OF AN ARC CURVATURE GENERATED IN A WAFER

TECHNICAL FIELD OF THE INVENTION

The present invention relates to a method and structure for performing compensation of bow generated in a wafer made from a material, in particular of semiconductor type.

Bow has been defined in the standard ASTM F534, § 3.1.2. As illustrated in FIG. 1, a wafer 1 presents:
- a front surface 10 and an opposite rear surface 11;
- a median surface $S_m$ defined as the set of points equidistant from the front and rear surfaces 10, 11 when wafer 1 is free from clamping.

Bow $B_w$, is the distance between the centre C of the median surface $S_m$ and a reference plane $P_{ref}$. Reference plane $P_{ref}$ is defined by three points located uniformly around a circle of smaller diameter than the nominal diameter of wafer 1. Bow $B_w$ is positive or negative depending on whether centre C is above or below reference plane $P_{ref}$.

Bow can be generated when a layer is formed on the wafer at a given temperature, the layer having a much higher, or much lower, coefficient of thermal expansion CTE than that of the wafer at a given temperature. This effect is called bimetal effect.

For non-restrictive example purposes, an envisaged application is epitaxy of GaN on a silicon wafer at 1050° C. for fabrication of light-emitting diodes. When the wafer presents a diameter of 200 mm, the person skilled in the art preferentially seeks to obtain a bow of less than 200 µm in absolute value, A bow of more than 200 µm is liable to give rise to defects, such as cracking or delamination, that are detrimental for the subsequent steps e.g. photolithography, robotized handling of the wafer etc.

STATE OF THE PRIOR ART

To compensate bow, it is known from the state of the art to form two metallic layers (or two dielectric layers) on the front and rear surfaces of the wafer. This method is in particular known for power component transfer applications.

It is also known from the state of the art, in particular from the document JP 2002134451, to form unfilled trenches on the front surface of the wafer to compensate warp of the wafer. The trenches are formed before grinding of the rear surface of the wafer. The trenches define a cutting path of the wafer.

It should be noted that warp differs from the bow defined in the foregoing. Warp has been defined in the ASTM F1390 standard. As illustrated in FIG. 2, a wafer 1 presents:
- a front surface 10 and an opposite rear surface 11;
- a median surface $S_m$ defined as the set of points equidistant from the front and rear surfaces 10, 11 when wafer 1 is free from clamping.

A reference plane $P_{ref}$ also exists defined by three points located uniformly around a circle of smaller diameter than the nominal diameter of wafer 1.

Warp $W_p$ is defined by the relation $W_p = D_{max,H} - D_{max,B}$ where:
- $D_{max,H}$ is the maximum distance between the median surface $S_m$ and the reference plane, taken above the reference plane $P_{ref}$;
- $D_{max,B}$ is the maximum distance between the median surface $S_m$ and the reference plane, taken below the reference plane $P_{ref}$.

Warp $W_p$ is always a positive number in so far as $D_{max,B}$ is a negative number by definition and method of calculation.

Such state-of-the-art methods are not entirely satisfactory in so far as they do not ensure a sufficiently small bow of the wafer (for example less than 200 µm in absolute value for a wafer diameter of 200 mm) when formation of a layer is performed at high temperature (for example about 1000° C.).

SUMMARY OF THE INVENTION

Accordingly, the object of the present invention is to either wholly or partially remedy the above-mentioned shortcomings, and relates for this purpose to a method for compensating bow generated in a wafer made from a material, the wafer comprising opposite first and second surfaces, the material of the wafer having a coefficient of thermal expansion, called CTE and noted $\alpha_0$; the method comprising the steps of:
a) forming a set of first trenches on the first surface of the wafer;
b) forming a set of second trenches on the second surface of the wafer, at least partially facing the first trenches;
c) filling the first trenches with a first material having a CTE $\alpha_1$;
d) filling the second trenches with a second material having a CTE $\alpha_2$, and verifying $\alpha_2 > \alpha_0$ or $\alpha_2 < \alpha_0$ depending on whether the first material verifies $\alpha_1 > \alpha_0$ or $\alpha_1 < \alpha_0$.

Accordingly, such a method according to the invention enables bow to be compensated by anticipation, i.e. before a step generating the bow, such as formation of a layer on the first surface of the wafer at high temperature.

In order to do this, the first trenches are filled with a first material different from the material of the wafer ($\alpha_1 \neq \alpha_0$), and second trenches are formed at least partially facing the first trenches. The second trenches are advantageously formed totally facing the first trenches, preferentially with a symmetry with respect to the longitudinal median plane of the wafer. The second trenches are filled with a second material that is able to be identical to the first material ($\alpha_1 = \alpha_2$), The choice of $\alpha_2$ is such that:

$$\alpha_2 > \alpha_0 \text{ if } \alpha_1 > \alpha_0,$$

$$\alpha_2 < \alpha_0 \text{ if } \alpha_1 < \alpha_0,$$

in order to obtain compensation of the bow.

The first material—called filling material—can comprise a set of N layers (N being a natural integer greater than or equal to 2) of different materials filling the first trenches. In this case, the CTE of the first material $\alpha_1$ is calculated in the following manner:

$$\alpha_1 = \sum_{i=1}^{N} \alpha_{1i} v_i$$

where:
- $\alpha_{1i}$ is the CTE of the material of the i-th layer,
- $v_i$ is the volumetric fraction of the material of the i-th layer inside the first trenches.

In the same way, the second material—called filling material—can comprise a set of N layers (N being a natural integer greater than or equal to 2) of different materials filling the second trenches. In this case, the CTE of the second material $\alpha_2$ is calculated in the following manner:

$$\alpha_2 = \sum_{i=1}^{N} \alpha_{2i} v_i$$

where:

$\alpha_{2i}$ is the CTE of the material of the i-th layer, $v_i$ is the volumetric fraction of the material of the i-th layer inside the second trenches.

Advantageously, the first and second materials respectively occupy a first volume $V_1$ and a second volume $V_2$ inside the first and second trenches on completion of steps c) and d); and step d) is executed such that $$V_2 = V_1 \times \frac{|\alpha_0 - \alpha_1|}{|\alpha_0 - \alpha_2|}.$$

In this way, such filling volumes enable compensation of the bow to be improved.

Advantageously, the first and second trenches respectively present a first form factor $\Phi_1$ and a second form factor $\Phi_2$ during steps a) and b), defined as the ratio between the width and depth of the corresponding trenches; and step b) is executed in such a way that $\Phi_2 = \Phi_1 \pm 20\%$, preferably $\Phi_2 = \Phi_1 \pm 15\%$, more preferentially $\Phi_2 = \Phi_1 \pm 10\%$.

In this way, such form factors enable compensation of the bow to be improved.

Advantageously, step a) is executed in such a way that the first trenches define a cutting path of the wafer, and step b) is preferably executed in such a way that the second trenches are totally facing the first trenches.

It is thus possible to enhance the cutting path in order to compensate the bow.

Advantageously, the method comprises a step $a_1$) consisting in coating the first trenches with a dielectric layer before step c), the dielectric layer preferably being an oxide layer.

Such a dielectric layer thus enables the first trenches to be electrically insulated from the wafer.

Advantageously, the method comprises a step $b_1$) consisting in coating the second trenches with a dielectric layer before step d), the dielectric layer preferably being an oxide layer.

Such a dielectric layer thus enables the second trenches to be electrically insulated from the wafer.

Advantageously, steps $a_1$) and $b_1$) are concomitant.

The operation time of the method is thereby reduced.

Advantageously, step d) is executed in such a way that the second material is identical to the first material, steps c) and d) preferably being concomitant.

Implementation of the method is thus simplified and the operation time is greatly reduced. Steps c) and d) are for example concomitant when the first and second materials are thermal oxides.

Advantageously, the method comprises:

a step $c_1$) consisting in planarizing the first material so as to be flush with the first surface after step c); and preferably a step $d_1$) consisting in planarizing the second material so as to be flush with the second surface after step d).

Presence of the first material outside the first trenches is thus avoided, in particular on the first surface of the wafer, in active areas for future components.

Steps $c_1$) and $d_1$) are preferentially performed by chemical mechanical polishing.

Preferentially, the first and second materials are selected from the group comprising polycrystalline silicon, a polyimide, a polyepoxide, an acrylic, an oxide, a nitride, and a glass.

Preferentially, the material of the wafer is selected from the group comprising a semiconductor material, a ceramic, a glass, and sapphire; the semiconductor material preferably being silicon-based.

The present invention also relates to a structure for performing compensation of bow, comprising:

a wafer made from a material, comprising opposite first and second surfaces, the wafer material having a coefficient of thermal expansion, called CTE and noted $\alpha_0$;

a set of first trenches formed on the first surface and filled with a first material having a CTE $\alpha_1$;

a set of second trenches formed on the second surface, at least partially facing the first trenches, and filled with a second material having a CTE $\alpha_2$, and verifying $\alpha_2 > \alpha_0$ or $\alpha_2 < \alpha_0$ depending on whether the first material verifies $\alpha_1 > \alpha_0$ or $\alpha_1 < \alpha_0$.

Such a structure according to the invention thereby enables bow to be compensated by anticipation, i.e. before a step generating the bow, such as formation of a layer on the first surface of the wafer at high temperature.

To do this, the first trenches are filled with a first material different from the material of the wafer ($\alpha_1 \neq \alpha_0$) and second trenches are formed at least partially facing the first trenches. The second trenches are advantageously formed totally facing the first trenches, preferentially with an axial symmetry. The second trenches are filled with a second material that is able to be identical to the first material ($a_1 = a_2$). The choice of $\alpha_2$ is such that:

$\alpha_2 > \alpha_0$ if $\alpha_1 > \alpha_0$, $\alpha_2 < \alpha_0$ if $\alpha_1 < \alpha_0$, in order to obtain compensation of the bow.

The first material—called filling material—can comprise a set of N layers (N being a natural integer greater than or equal to 2) of different materials filling the first trenches. In this case, the CTE of the first material $\alpha_1$ is calculated in the following manner:

$$\alpha_1 = \sum_{i=1}^{N} \alpha_{1i} v_i$$

where:

$\alpha_{1i}$ is the CTE of the material of the i-th layer, $v_i$ is the volumetric fraction of the material of the i-th layer inside the first trenches.

In the same way, the second material—called filling material—can comprise a set of N layers (N being a natural integer greater than or equal to 2) of different materials filling the second trenches. In this case, the CTE of the second material $\alpha_2$ is calculated in the following manner:

$$\alpha_2 = \sum_{i=1}^{N} \alpha_{2i} v_i$$

where:

$\alpha_{2i}$ is the CTE of the material of the i-th layer, $v_i$ is the volumetric fraction of the material of the i-th layer inside the second trenches.

Advantageously, the first and second materials respectively occupy a first volume $V_1$ and a second volume $V_2$ inside the first and second trenches, and verifying $$V_2 = V_1 \times \frac{|\alpha_0 - \alpha_1|}{|\alpha_0 - \alpha_2|}.$$

In this way, such filling volumes enable compensation of the bow to be improved.

Advantageously, the first and second trenches respectively present a first form factor $\Phi_1$ and a second form factor $\Phi_2$ defined as the ratio between the width and depth of the corresponding trenches; and verifying $\Phi_2 = \Phi_1 \pm 20\%$, preferably $\Phi_2 = \Phi_1 \pm 15\%$, more preferentially $\Phi_2 = \Phi_1 \pm 10\%$.

In this way, such form factors enable compensation of the bow to be improved.

Advantageously, the first trenches are coated with a dielectric layer inserted between the wafer material and the first material; and the second trenches are preferably coated with a dielectric layer inserted between the wafer material and the second material.

Such dielectric layers thus enable the first and second trenches to be electrically insulated from the wafer.

Advantageously, the first material is flush with the first surface; and preferably the second material is flush with the second surface.

Presence of the first material outside the first trenches is thus avoided, in particular on the first surface of the wafer, in active areas for future components.

BRIEF DESCRIPTION OF THE DRAWINGS

Other features and advantages will become more clearly apparent from the following description of different embodiments of the invention, given for non-restrictive example purposes, with reference to the appended drawings, in which.

DETAILED DESCRIPTION OF THE EMBODIMENTS

Figure 1:
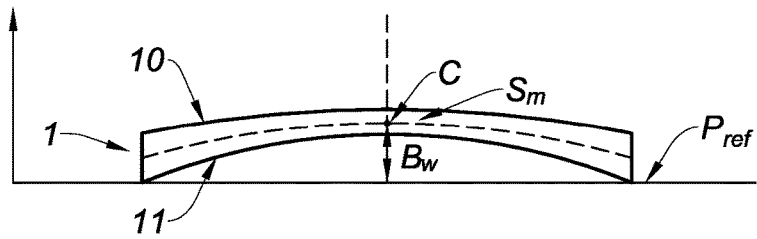
FIG. 1 (already described) is a schematic cross-sectional view of a wafer sustaining a bow.

For the different embodiments, the technical features described hereafter are to be considered either alone or in any technically possible combination; the same reference numerals are used for parts that are identical or perform the same function, for the sake of simplification of the description.

Definitions

What is meant by "wafer" is:
a sliced part of a semiconductor material ingot, conventionally a disc, used as base material to form components,
or more generally a preferably self-supported substrate of a material (e.g. a ceramic, a glass, sapphire).

What is meant by "semiconductor" is that the material presents an electric conductivity at 300 K comprised between $10^{-8}$ S/cm and $10^3$ S/cm.

What is meant by "dielectric" is that the material presents an electric conductivity at 300 K of less than $10^{-8}$ S/cm.

What is meant by "longitudinal" is a direction perpendicular to the normal to the first and second surfaces of the wafer.

Figure 2:
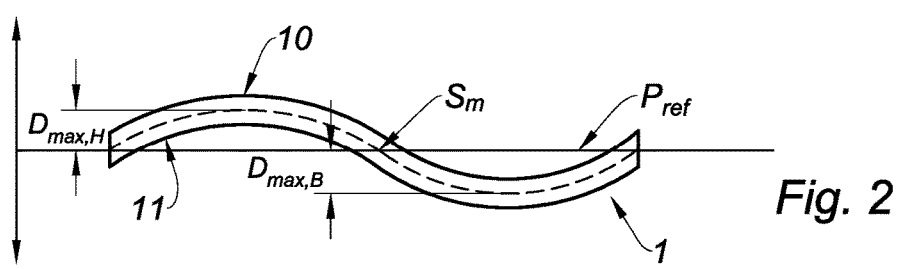
FIG. 2 (already described) is a schematic cross-sectional view of a wafer sustaining a warp.
Figure 3:
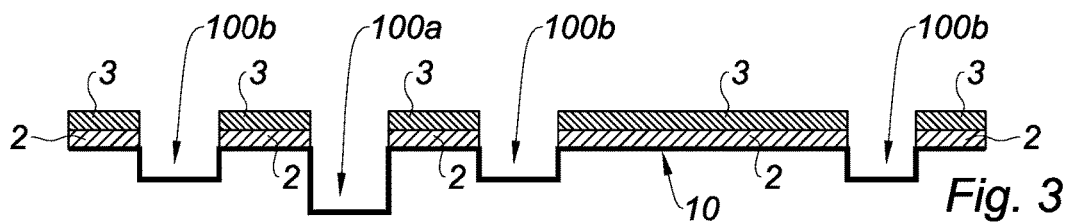
FIGS. 3 to 5 are schematic cross-sectional views illustrating steps of a method according to the invention.

The method illustrated in FIGS. 1 to 3 is a method for performing compensation of bow generated in a wafer 1 made from a material, wafer 1 comprising opposite first and second surfaces 10, 11, the material of wafer 1 having a coefficient of thermal expansion, called CTE and noted $\alpha_0$; the method comprising the steps of;

a) forming a set of first trenches 100a, 100b on the first surface 10 of wafer 1;

b) forming a set of second trenches 110 on the second surface 11 of wafer 1, at least partially facing first trenches 100a, 100b;

c) filling first trenches 100a, 100b with a first material $M_1$ having a CTE $\alpha_1$;

d) filling second trenches 110 with a second material $M_2$ having a CTE $\alpha_2$, and verifying $\alpha_2 > \alpha_0$ or $\alpha_2 < \alpha_0$ depending on whether first material $M_1$ verifies $\alpha_1 > \alpha_0$ or $\alpha_1 < \alpha_0$.

Wafer

The material of wafer 1 is preferentially selected from the group comprising a semiconductor material, a ceramic, a glass, or sapphire. The semiconductor material of wafer 1 is preferentially silicon-based. For example purposes, $\alpha_0$ (Si) $=2.5 \times 10^{-6}$ $K^{-1}$ at 300 K. The silicon is advantageously doped so that wafer 1 presents a resistivity of less than 1 ohm.cm, preferentially less than $10^{-2}$ ohm.cm.

First trenches

First trenches 100a, 100b preferentially comprise primary first trenches 100a and secondary first trenches 100b. Step a) is advantageously executed in such a way that primary first trenches 100a define a cutting path of wafer 1. Secondary first trenches 100b are advantageously arranged to electrically insulate electronic components 4 from first surface 10 of wafer 1. Primary first trenches 100a are deeper than secondary first trenches 100b. As illustrated in FIG. 3, first trenches 100a, 100b are formed during step a) preferentially by previously depositing a hard mask 2 and a photoresist 3 on first surface 10 of wafer 1. Then first trenches 100a, 100b are formed during step a) by photolithography and etching steps.

First material $M_1$ occupies a first volume $V_1$ inside first trenches 100a, 100b on completion of step c), The method advantageously comprises a step $c_1$) consisting in planarizing first material $M_1$ so as to be flush with first surface 10 after step c). Step $c_1$) is preferentially performed by chemical mechanical polishing.

First material $M_1$ is advantageously selected from the group comprising polycrystalline silicon, a polyimide, a polyepoxide, an acrylic, an oxide, a nitride, and a glass.

First trenches 100a, 100b present a first form factor $\Phi_1$ in step a). $\Phi_1$ is defined as the ratio between the width $I_1$ and depth $H_1$ of the corresponding first trenches 100a, 100b.

The method advantageously comprises a step $a_1$) consisting in coating first trenches 100a, 100b with a dielectric layer 101 before step c). Dielectric layer 101 is preferentially an oxide layer, such as $SiO_2$ when the semiconductor material of wafer 1 is Si-based. The oxide layer is preferentially a thermal oxide. First material $M_1$ can be identical to dielectric layer 101. For example, a $(SiO_2)=0.6 \times 10^{-6}$ $K^{-1}$ at 300 K. However, for certain applications, first trenches 100a, 100b present a depth $H_1$ comprised between 50 µm and 100 µm; filling of the latter with a thermal oxide would result in a very long operation time and in a low mechanical strength with temperature. It may therefore be preferable to use a different first material $M_1$ from $SiO_2$, such as polycrystalline silicon for certain applications.

Second trenches

Second trenches 110 are formed during step b) preferentially by previously depositing a hard mask 2 and a photoresist 3 on second surface 11 of wafer 1. Then second trenches 110 are formed in step b) by photolithography and etching steps.

Figure 4:
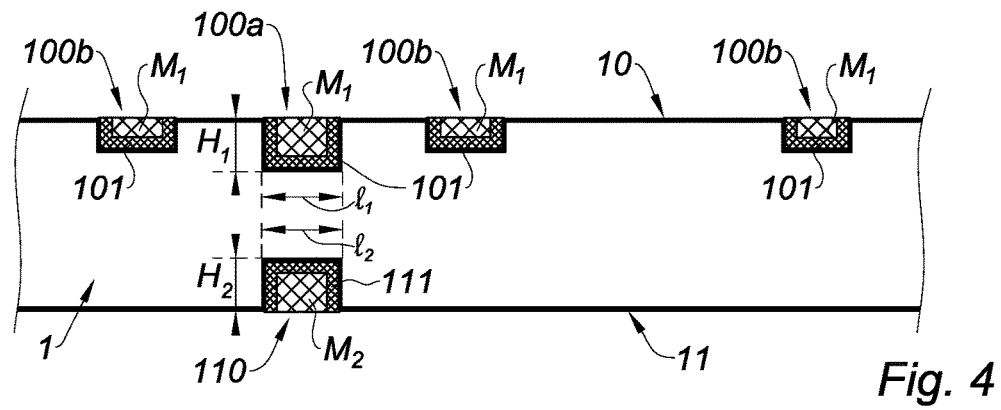
Figure 5:
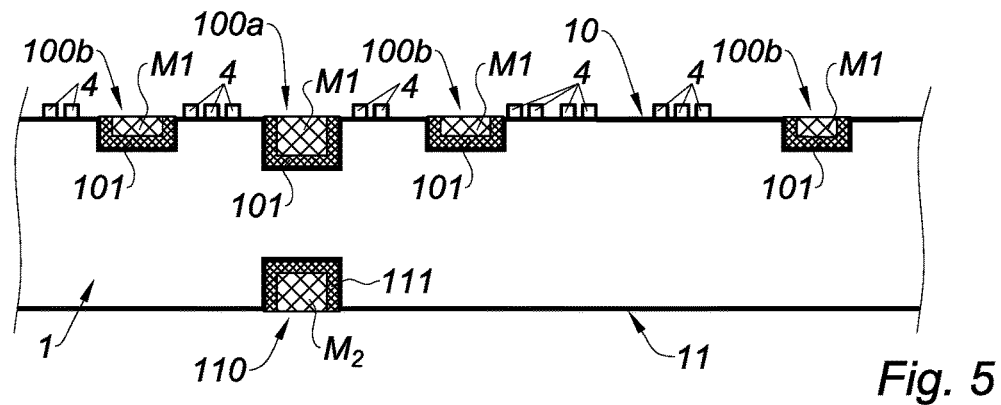

Step b) is preferentially executed in such a way that at least one second trench 110 of the set of second trenches 110 is totally facing at least one first trench 100a, 100b. Step b) is advantageously executed in such a way that second trenches 110 are at least partially, preferably totally, facing primary first trenches 100a, as illustrated in FIG. 4, Step b) can also be executed in such a way that second trenches 110 are at least partially, preferably totally, facing primary first trenches 100a and secondary first trenches 100b. Implementation of steps a) and b) is particularly simplified when second trenches 110 are facing primary first trenches 100a, or even primary first trenches 100a and secondary first trenches 100b, in so far as it is possible to use the same mask alignment for their formation. Wafer 1 presents a longitudinal median plane. Second trenches 110 and primary first trenches 100a are advantageously symmetrical with respect to the longitudinal median plane. Second trenches 110 and primary first trenches 100a and secondary first trenches 100b are advantageously symmetrical relatively to the longitudinal median plane.

Second material $M_2$ occupies a second volume $V_2$ inside second trenches 110 on completion of step d). The method advantageously comprises a step $d_1$) consisting in planarizing second material $M_2$ so as to be flush with second surface 11 after step d), Step $d_1$) is preferentially performed by chemical mechanical polishing.

Second material $M_2$ is advantageously selected from the group comprising polycrystalline silicon, a polyimide, a polyepoxide, an acrylic, an oxide, a nitride, and a glass. Second material $M_2$ is advantageously identical to first material $M_1$ so that steps c) and d) can be concomitant.

Step d) is advantageously executed in such a way that $$V_2 = V_1 \times \frac{|\alpha_0 - \alpha_1|}{|\alpha_0 - \alpha_2|}.$$

Calculation can be performed using Stoney's formula.

Second trenches 110 present a first form factor $\Phi_2$ in steps b). $\Phi_2$ is defined as the ratio between the width $I_2$ and the depth $H_2$ of the corresponding second trenches 110. Step b) is advantageously executed in such a way that $\Phi_2=\Phi_1\pm20\%$, preferably $\Phi_2=\Phi_1\pm15\%$, more preferentially $\Phi_2=\Phi_1\pm10\%$.

The method advantageously comprises a step $b_1$) consisting in coating second trenches 110 with a dielectric layer 111 before step d). Dielectric layer 111 is preferentially an oxide layer such as $SiO_2$ when the semiconductor material of wafer 1 is Si-based. The oxide layer is preferentially a thermal oxide. When dielectric layers 101, 111 are thermal oxides, steps $a_1$) and $b_1$) are advantageously concomitant. Second material $M_2$ can be identical to dielectric layer 111. For example purposes, $\alpha$ ($SiO_2$)=$0.6\times10^{-6}$ $K^{-1}$ at 300 K. However, for certain applications, second trenches 110 present a depth $H_2$ comprised between 50 µm and 100 µm; filling of the latter with a thermal oxide would result in a very long operation time and a low mechanical strength with temperature. It may therefore be preferable to use a different second material $M_2$ from $SiO_2$, such as polycrystalline silicon for certain applications.

Simulations enable it to be observed that the parameters ($\alpha_2$, $V_2$, $\Phi_2$) defined according to the invention optimize compensation of the bow.

Application Example

On completion of the method according to the invention, it is possible to form components 4, such as light-emitting diodes, on first surface 10 of wafer 1. The light-emitting diodes can be formed by epitaxy of GaN, at a temperature of 1050° C. The light-emitting diodes are then preferentially coated with a protective substrate (or support substrate called handle) assembled on first surface 10 of wafer 1 by bonding. The handle can be temporary or permanent. This results in temporary or permanent bonding. The protective substrate is made from a material preferentially selected from the group comprising a glass, silicon, quartz, and sapphire. More generally, any rigid substrate, transparent in the emission spectrum of the light-emitting diodes, can be suitable for use as protective substrate. Then second surface 11 of wafer 1 is thinned until first trenches 110 are reached. Thinned second surface 11 will then be metallized for the contact connections.

Other applications can naturally be envisaged such as:
  microfluidics applications when the material of wafer 1 is a glass,
  hybrid microelectronics applications when the material of wafer 1 is a ceramic.

The Invention claimed is:

1. Method for performing compensation of a bow generated in a wafer made from a material, the wafer comprising opposite first and second surfaces, the material of the wafer having a coefficient of thermal expansion noted $\alpha_0$; the method comprising the steps of:
    a) forming a set of first trenches on the first surface of the wafer, the first surface being designed to comprise electronic components;
    b) forming a set of second trenches on the second surface of the wafer, at least partially facing the first trenches;
    c) filling the first trenches with a first material having a coefficient of thermal expansion $\alpha_1$;
    d) filling the second trenches with a second material having a coefficient of thermal expansion $\alpha_2$, and verifying $\alpha_2>\alpha_0$ or $\alpha_2<\alpha_0$ depending on whether the first material verifies $\alpha_1>\alpha_0$ or $\alpha_1<\alpha_0$,
    wherein step a) is executed in such a way that first trenches of the set of first trenches define a cutting path of the wafer and step b) is executed in such a way that the set of second trenches are totally facing said first trenches of the set of first trenches.

2. Method according to claim 1, wherein the first and second materials respectively occupy a first volume $V_1$ and a second volume $V_2$ inside the first and second trenches on completion of steps c) and d); and step d) is executed in such a way that $$V_2 = V_1 \times \frac{|\alpha_0 - \alpha_1|}{|\alpha_0 - \alpha_2|}.$$

3. Method according to claim 1, wherein the first and second trenches respectively present a first form factor $\Phi_1$ and a second form factor $\Phi_2$ in steps a) and b), defined as the ratio between the width and depth of the corresponding trenches; and step b) is executed in such a way that $\Phi_2=\Phi_1\pm20\%$.

4. Method according to claim 3, wherein step b) is executed in such a way that $\Phi_2=\Phi_1\pm15\%$, or $\Phi_2=\Phi_1\pm10\%$.

5. Method according to claim 1, comprising a step $a_1$) consisting in coating the first trenches with a dielectric layer before step c), the dielectric layer preferentially being an oxide layer.

6. Method according to claim 1, comprising a step $b_1$) consisting in coating the second trenches with a dielectric layer before step d), the dielectric layer preferentially being an oxide layer.

7. Method according to claim 6, wherein steps $a_1$) and $b_1$) are concomitant.

8. Method according to claim 1, wherein step d) is executed in such a way that the second material is identical to the first material, steps c) and d) preferably being concomitant.

9. Method according to claim 1, comprising:
a step $c_1$) consisting in planarizing the first material so as to be flush with the first surface after step c); and preferably a step $d_1$) consisting in planarizing the second material so as to be flush with the second surface after step d).

10. Method according to claim 1, wherein the first and second materials are selected from the group comprising polycrystalline silicon, a polyimide, a polyepoxide, an acrylic, an oxide, a nitride, and a glass.

11. Method according to claim 1, wherein the material of the wafer is selected from the group comprising a semiconductor material, a ceramic, a glass, and sapphire; the semiconductor material preferably being silicon-based.

12. Structure for performing compensation of a bow, comprising:
a wafer made from a material, comprising opposite first and second surfaces, the material of the wafer having a coefficient of thermal expansion noted $\alpha_0$;
a set of first trenches formed on the first surface and filled with a first material having a coefficient of thermal expansion $\alpha_1$;
a set of second trenches formed on the second surface, at least partially facing the first trenches and filled with a second material having a coefficient of thermal expansion $\alpha_2$, and verifying $\alpha_2 > \alpha_0$ or $\alpha_2 < \alpha_0$ depending on whether the first material verifies $\alpha_1 > \alpha_0$ or $\alpha_1 < \alpha_0$,
wherein first trenches of the set of first trenches define a cutting path of the wafer and the set of second trenches are totally facing said first trenches of the set of first trenches.

13. Structure according to claim 12, wherein the first and second materials respectively occupy a first volume $V_1$ and a second volume $V_2$ inside the first and second trenches and verifying $$V_2 = V_1 \times \frac{|\alpha_0 - \alpha_1|}{|\alpha_0 - \alpha_2|}.$$

14. Structure according to claim 12, wherein the first and second trenches respectively present a first form factor $\Phi_1$ and a second form factor $\Phi_2$, defined as the ratio between the width and depth of the corresponding trenches; and verifying $\Phi_2 = \Phi_1 \pm 20\%$, preferably $\Phi_2 = \Phi_1 \pm 15\%$, more preferentially $\Phi_2 = \Phi_1 \pm 10\%$.

15. Structure according to claim 12, wherein the first trenches are coated with a dielectric layer inserted between the material of the wafer and the first material; and the second trenches are preferably coated with a dielectric layer inserted between the material of the wafer and the second material.

16. Structure according to claim 12, wherein the first material is flush with the first surface; and preferably the second material is flush with the second surface.

17. Method according to claim 1, wherein the set of first trenches comprises primary first trenches and secondary first trenches, the primary first trenches being deeper than secondary first trenches and wherein the primary first trenches define the cutting path and the secondary first trenches are arranged to electrically insulate electronic components on first surface of wafer.

18. Structure according to claim 12, wherein the set of first trenches comprises primary first trenches and secondary first trenches, the primary first trenches being deeper than secondary first trenches and wherein the primary first trenches define the cutting path and the secondary first trenches are arranged to electrically insulate electronic components on first surface of wafer.

* * * * *